US008118611B2

(12) United States Patent
Jeon (10) Patent No.: US 8,118,611 B2
(45) Date of Patent: Feb. 21, 2012

(54) PCB BRIDGE CONNECTOR FOR CONNECTING PCB DEVICES

(76) Inventor: Myoungsoo Jeon, Harrisburg, PA (US)

( * ) Notice: Subject to any disclaimer, the term of this patent is extended or adjusted under 35 U.S.C. 154(b) by 0 days.

(21) Appl. No.: 12/590,083

(22) Filed: Oct. 30, 2009

(65) Prior Publication Data

US 2010/0112833 A1    May 6, 2010

Related U.S. Application Data

(60) Provisional application No. 61/110,042, filed on Oct. 31, 2008.

(51) Int. Cl.
    *H01R 31/08*    (2006.01)
(52) U.S. Cl. ........................................................ 439/511
(58) Field of Classification Search .................. 439/511, 439/65, 67, 77, 82, 751, 79
    See application file for complete search history.

(56) References Cited

U.S. PATENT DOCUMENTS

| | | | | | |
|---|---|---|---|---|---|
| 3,028,573 | A | * | 4/1962 | Stoehr | 439/48 |
| 3,371,249 | A | * | 2/1968 | Prohofsky | 361/792 |
| 4,420,794 | A | * | 12/1983 | Anderson | 361/809 |
| 4,521,969 | A | * | 6/1985 | Greenwood | 33/645 |
| 4,602,317 | A | * | 7/1986 | Rovnyak et al. | 361/785 |
| 4,686,607 | A | * | 8/1987 | Johnson | 361/788 |
| 4,838,798 | A | * | 6/1989 | Evans et al. | 439/61 |
| 5,075,821 | A | * | 12/1991 | McDonnal | 361/721 |
| 5,093,985 | A | * | 3/1992 | Houldsworth et al. | 29/830 |
| 5,522,727 | A | * | 6/1996 | Saito et al. | 439/65 |
| 5,523,695 | A | * | 6/1996 | Lin | 324/756.02 |
| 5,709,557 | A | * | 1/1998 | Martin et al. | 439/79 |
| 5,844,783 | A | * | 12/1998 | Kojima | 361/777 |
| 5,887,158 | A | * | 3/1999 | Sample et al. | 716/137 |
| 6,040,624 | A | * | 3/2000 | Chambers et al. | 257/692 |
| 6,448,508 | B1 | * | 9/2002 | Lequenne | 174/261 |
| 6,512,293 | B1 | * | 1/2003 | Chia et al. | 257/730 |
| 6,603,079 | B2 | * | 8/2003 | Biron | 174/254 |
| 6,890,187 | B2 | * | 5/2005 | Norris | 439/76.1 |
| 7,012,812 | B2 | * | 3/2006 | Haba | 361/792 |
| 7,085,146 | B2 | * | 8/2006 | Pitzele | 363/147 |
| 7,247,031 | B2 | * | 7/2007 | Naito et al. | 439/75 |
| 7,304,373 | B2 | * | 12/2007 | Taggart et al. | 257/686 |
| 7,438,581 | B1 | * | 10/2008 | Jeon | 439/342 |
| 7,618,283 | B1 | * | 11/2009 | Costello | 439/511 |
| 2002/0032531 | A1 | * | 3/2002 | Mansky et al. | 702/21 |
| 2002/0171634 | A1 | * | 11/2002 | Matsufusa | 345/173 |
| 2005/0245118 | A1 | * | 11/2005 | Liu et al. | 439/329 |
| 2006/0073709 | A1 | * | 4/2006 | Reid | 439/65 |
| 2006/0264076 | A1 | * | 11/2006 | Chen | 439/82 |
| 2007/0275587 | A1 | * | 11/2007 | Chang et al. | 439/327 |

* cited by examiner

*Primary Examiner* — Tulsidas C Patel
*Assistant Examiner* — Harshad Patel
(74) *Attorney, Agent, or Firm* — Imperium Patent Works; T. Lester Wallace; Amir V. Adibi

(57) ABSTRACT

A bridge connector made of PCB material has a first plurality of press-fit pins on one portion of the bridge connector and a second plurality of press-fit pins on another portion of the bridge connector. Within the connector is a set of signal conductors. Each conductor connects a press-fit pin of the first plurality of press-fit pins to a corresponding press-fit pin of the second plurality of press-fit pins. When the connector is attached to a printed circuit board (PCB), the press-fit pins extend into and engage corresponding plated through holes in the PCB. The press-fit pins exert enough retention force to mechanically couple two PCB frame sections. The PCB frame sections are electrically connected through the press-fit pins and corresponding signal conductors of the bridge connector. A bridge connector attached at each corner of an infrared touch sensor frame assembly allows the assembly to be solidly assembled from four sections of PCB: a top, bottom, left, and right PCB frame section.

15 Claims, 13 Drawing Sheets

CLOSE UP VIEW OF BRIDGE CONNECTOR
BEFORE ATTACHING LEFT AND BOTTOM PIECES

GRID JUMPER ATTACHING TWO PCB COMPONENTS

FOUR-PIECE IR TOUCH PANEL UTILIZING
BRIDGE CONNECTORS

FIG. 5

CLOSE UP VIEW OF BRIDGE CONNECTOR
ATTACHING LEFT AND BOTTOM PIECES

FIG. 6

CLOSE UP VIEW OF BRIDGE CONNECTOR
BEFORE ATTACHING LEFT AND BOTTOM PIECES

FIG. 7

BRIDGE CONNECTOR SIDE VIEW

FIG. 8

BRIDGE CONNECTOR BOTTOM VIEW

FIG. 9

BRIDGE CONNECTOR EXPLODED VIEW
FIG. 10

CLOSE UP VIEW OF COMPLIANT PINS
FIG. 11

FIG. 12
(ANOTHER EMBODIMENT)

CLOSE UP VIEW OF SNAP PINS
FIG. 13

FIG. 14

BRIDGE CONNECTOR FOR A SOLDER COLUMN ASSEMBLY

FIG. 15
(ANOTHER EMBODIMENT)

FIG. 16
(ANOTHER EMBODIMENT)

BRIDGE CONNECTOR FOR NO ELECTRICAL CONNECTION

FIG. 17

(ANOTHER EMBODIMENT)

GRID JUMPER UTILIZING FLEXIBLE PRINTED CIRCUIT ASSEMBLY

FIG. 18
(ANOTHER EMBODIMENT)

GRID JUMPER ATTACHING TWO PCB COMPONENTS

FIG. 19

GRID JUMPER UTILIZING FLEXIBLE PRINTED CIRCUIT ASSEMBLY

FIG. 20
(ANOTHER EMBODIMENT)

GRID JUMPER ATTACHING TWO PCB COMPONENTS

FIG. 21

PCB BRIDGE CONNECTOR FOR CONNECTING PCB DEVICES

CROSS REFERENCE TO RELATED APPLICATION

This application claims the benefit under 35 U.S.C. §119 of provisional application Ser. No. 61/110,042, entitled "Connector Having Printed Circuit Board Portion", filed Oct. 31, 2008. The subject matter of provisional application Ser. No. 61/110,042 is incorporated herein by reference.

TECHNICAL FIELD

The described embodiments relate to PCB bridge connectors, and, more specifically, bridge connectors for connecting two sections of an infrared touch sensor frame assembly.

BACKGROUND INFORMATION

Figure 1:
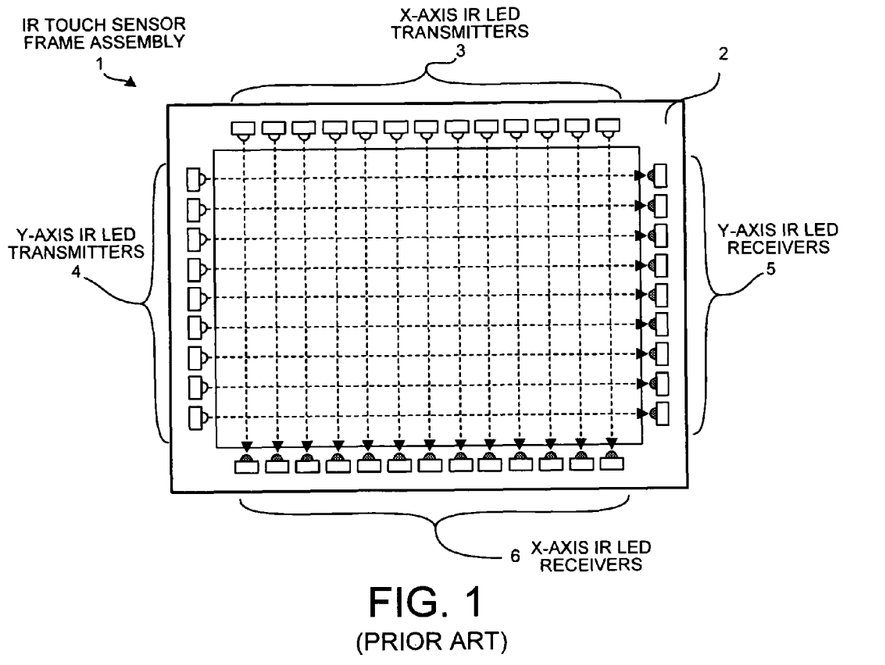
FIG. 1 (Prior Art) is a diagram of an IR touch sensor frame assembly.

FIG. 1 (Prior Art) is a stylized view of an infrared (IR) touch sensor frame assembly 1. A printed circuit board (PCB) frame body 2 has a portion of PCB material cut out of the center of the body such that the remaining PCB material forms a single-piece, four-sided frame. IR light emitting diode (LED) transmitters and receivers are disposed on the PCB frame body 2 for touch sensing. A series of X-axis IR LED transmitters 3 are arranged on one side of the PCB frame body 2 opposite a matching series of X-axis IR LED receivers 6. A series of Y-axis IR LED transmitters 4 are arranged on one side of the PCB frame body 2 opposite a matching series of Y-axis IR LED receivers 5. The IR LED transmitters and receivers are electrically connected through the PCB frame body 2 to a controller (not shown). A screen typically fits in the cut-out center of the PCB frame body.

Figure 2:
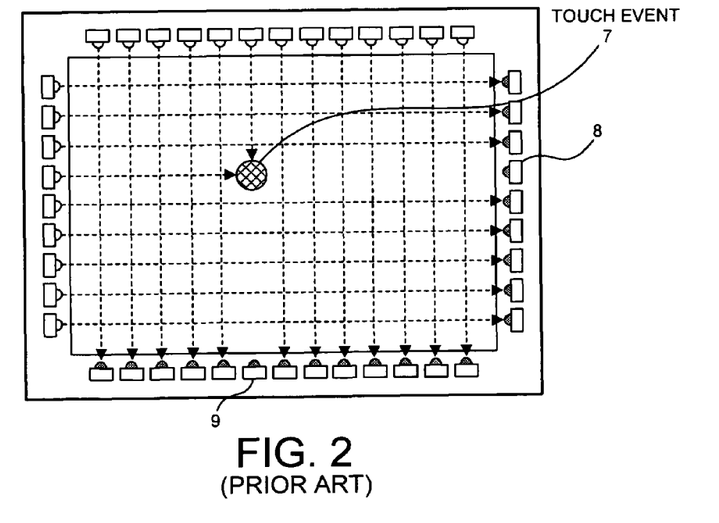
FIG. 2 (Prior Art) is a diagram of a touch event on the IR touch sensor screen.

Signals from the IR LED transmitters and receivers disposed along sides of the IR touch sensor assembly are utilized by a controller to determine the location where a user touches the screen. In FIG. 2 (Prior Art) touch event 7 represents the user's finger or pen stylus as it is pressed against the display at a particular location. The object creating the touch event 7 is typically a pen stylus or a finger pressed on the framed screen. In one example of a touch event 7, the object causing the event blocks the beam of infrared light from one of the series of IR LED transmitters disposed along the X-axis 3 from being received by the associated X-axis IR receiver 9. Based on the signals from the X-axis IR transmitters and receivers, the controller determines the X-axis position of the touch object 7. And, the object 7 blocks the beam of infrared light from one of the series of IR LED transmitters for the Y-axis 4 from being received by the associated Y-axis IR receiver 8. Based on the signals from the Y-axis IR transmitters and receivers, the controller determines the Y-axis position of the touch object 7. Thus, the position of the user's touch on the associated screen is determined by a controller.

Figure 3:
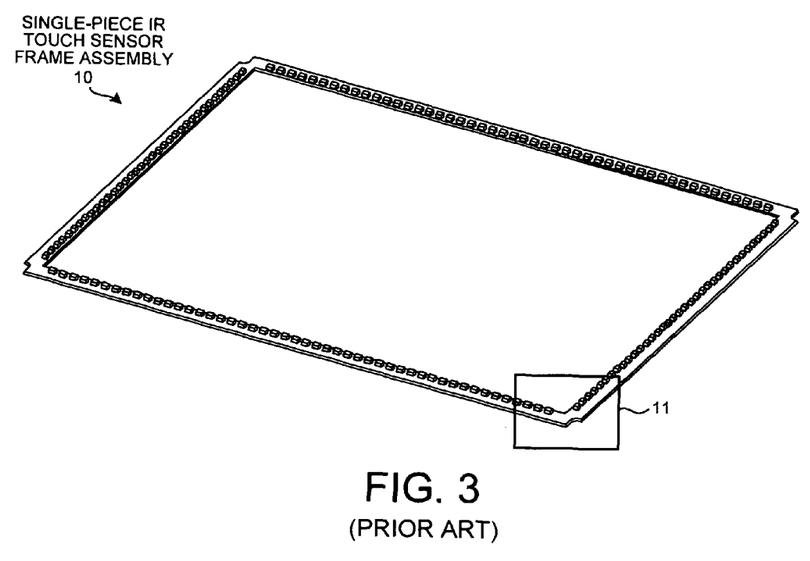
FIG. 3 (Prior Art) is a top view of a typical one-piece infrared touch frame assembly.

FIG. 3 (Prior Art) is a view of the top side of a typical one-piece IR touch sensor frame assembly 10. Corner section 11 connects bottom and side edges of the IR touch sensor frame assembly 10 such that there are no breaks in the PCB frame material. Corner section 11 has a beveled elbow cut-out for fitting into a casing.

Figure 4:
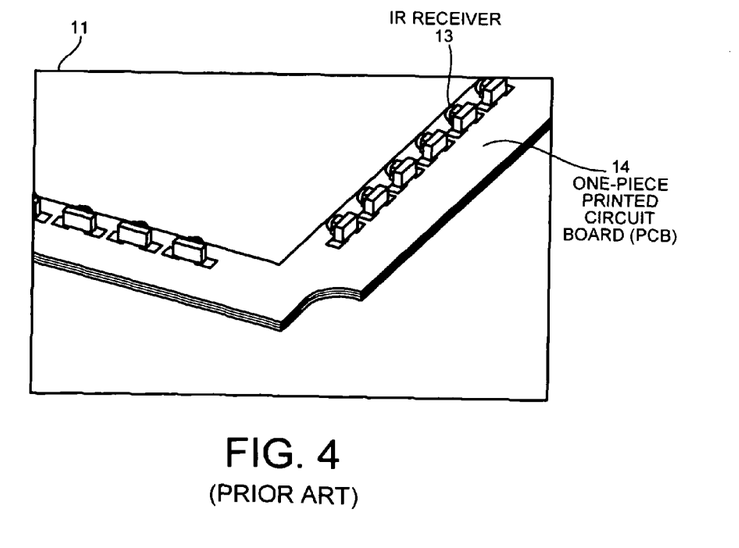
FIG. 4 (Prior Art) is an exploded view of a corner section of the one-piece IR touch frame assembly.

FIG. 4 (Prior Art) is an exploded view 11 of the corner section 11 of the assembly of FIG. 3. Assembly 10 is a one-piece printed circuit board 14. A Y-axis IR receiver 13 is shown as it is disposed on one side of one-piece printed circuit board 14. Y-axis IR receiver 13 is electrically connected through the printed circuit board 14 such that electrical signals are transmitted from Y-axis IR receiver 13, through the printed circuit board 14 and to a controller for processing the signals.

Formation of an IR touch sensor frame from one piece of PCB material has several drawbacks. The center cut-out portion of PCB must be discarded, resulting in expensive waste of PCB material. Due to the rectangular shape and unused center space, storing and shipping of such assemblies is inefficient. Furthermore, if a component (such as a receiver or transmitter) is damaged, the entire assembly must be discarded. A method of assembling PCB frame sections such that they can be mechanically and electrically coupled at their corners is desired.

SUMMARY

A bridge connector made of layers of PCB material has a first grouping of press-fit pins on one portion of the bridge connector and a second grouping of press-fit pins on another portion of the bridge connector. The press-fit pins are typically stamped from a sheet of conductive copper alloy. Within the connector is a set of signal conductors. Each conductor connects a press-fit pin of the first grouping to a corresponding press-fit pin of the second grouping.

When the bridge connector is attached to a printed circuit board (PCB), the press-fit pins extend into, and engage corresponding plated through holes in the PCB. The press-fit pins exert enough retention force to mechanically couple two PCB frame sections. The PCB frame sections are electrically connected through the press-fit pins and corresponding signal conductors of the bridge connector. A bridge connector attached at each corner of an IR touch sensor frame assembly allows the assembly to be solidly assembled from four sections of PCB: a top, bottom, left, and right PCB frame section. Prototyping, shipping and repairing an IR touch sensor frame using four PCB frame sections is easier and less expensive than with a one-piece IR touch sensor frame.

In one embodiment, the press-fit pins are compliant pins that can be mechanically coupled to a PCB frame section by an assembly tool. In another embodiment, a press-fit pin is a snap pin with a spring-beam portion that snaps into a through hole of a PCB frame section. In another embodiment, electrical coupling between the bridge connector and PCB frame sections is provided by solder columns or solder balls, and mechanical coupling is provided by injection-molded location pegs. In another embodiment, a grid jumper having a flexible portion is used to couple two PCB components.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 5:
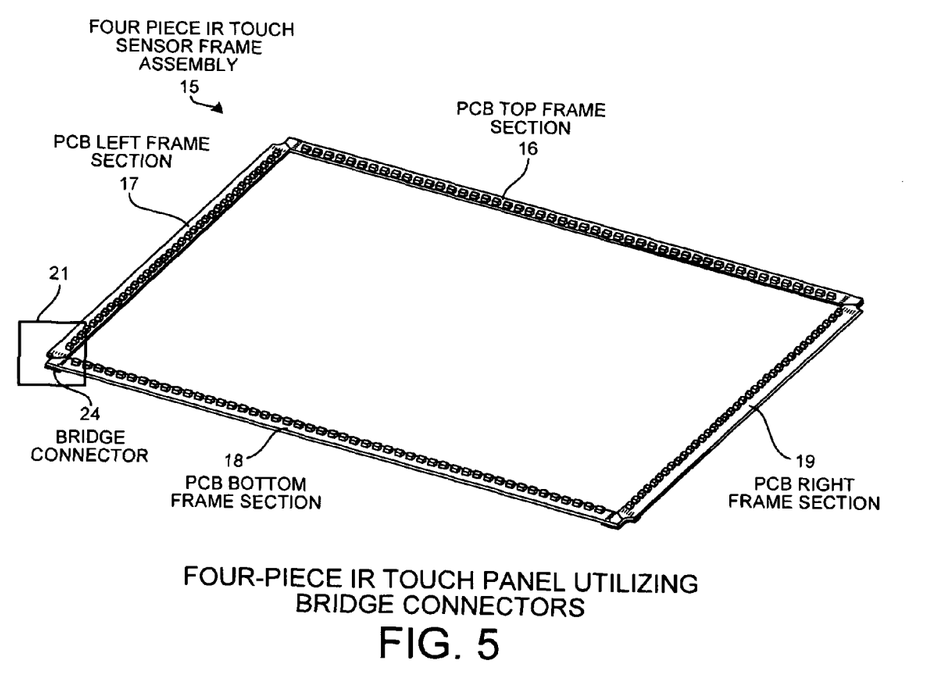
FIG. 5 is a top view of a four-piece IR touch frame assembly.

FIG. 5 is a view of the top side of a four-piece IR touch frame assembly 15. A series of IR LED transmitters are disposed on PCB top frame section 16 and arranged so as to correspond to a series of IR LED receivers disposed on PCB bottom frame section 18. Another series of IR LED transmitters are disposed on PCB left frame section 17 and arranged so as to correspond to a series of IR LED receivers disposed on PCB right frame section 19. PCB left frame section 17 and PCB bottom frame section 18 are coupled together, through bridge connector 24, in an L-shaped arrangement at a corner section 21 of the IR touch frame assembly 15.

Example dimensions of a four-piece IR touch sensor frame assembly are 8.5 inches in a vertical dimension and 11 inches in a horizontal dimension. The frame assembly 15 is arranged in a window shape so that a screen can be disposed in the center of the frame assembly. PCB material construction allows frame sections to be under 5 millimeters in width. A PCB frame section of the assembly in FIG. 5 typically is an elongated structure so that minimal PCB material is utilized. Usually, such sections of PCB making up the assembly are at least ten times longer than they are wide.

PCB frame sections are formed of layers of PCB material, with each layer having one or more electrically conductive plated through holes at one end and a matching number of electrically conductive plated through holes at the other end. Conductors disposed on each layer of PCB material connect matching plated through holes. In the described example, the PCB frame sections are formed of two layers of PCB material. Accordingly, the described example of bridge connector 24 is designed with a top layer and bottom layer to match the PCB frame sections. More layers of PCB material can be used, depending on the design of the PCB frame sections.

Figure 6:
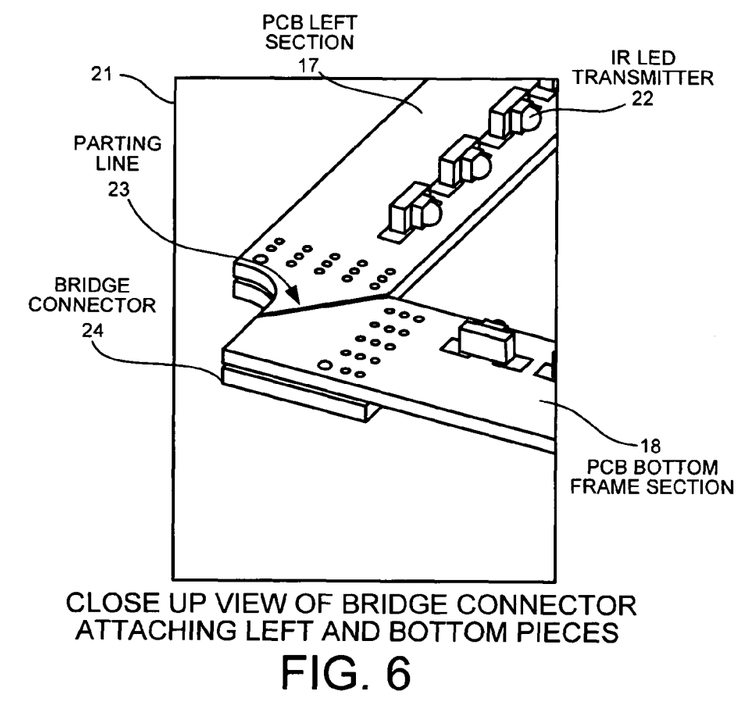
FIG. 6 is an expanded view of a corner section of the four-piece IR touch frame assembly of FIG. 5.

FIG. 6 is an expanded view of corner section 21 of FIG. 5. PCB left frame section 17 meets PCB bottom frame section 18 at parting line 23. Parting line 23 separates frame sections at a distance of approximately 0.2 millimeters due to the manufacturing tolerances of PCB material. A two-dimensional array of electrically conductive plated through holes is situated at the corner end of PCB left frame section 17. A matching two-dimensional array of electrically conductive plated through holes is situated at the corner end of PCB bottom frame section 18. Bottom side of bridge connector 24 is coupled to bottom side of PCB left frame section 17 and PCB bottom frame section 18, holding both frame sections in place relative to the other.

The design of the bridge connector 24 varies based upon the design of the PCB frame sections to be connected. The example of FIG. 6 shows that the corner end of PCB left frame section 17 and the corner end of PCB bottom frame section 18 each have fourteen electrically conductive plated through holes. The planar body of bridge connector 24 is shaped to match the joined planar bodies of PCB frame sections. Additionally, example bridge connector 24 has one group of fourteen electrically conductive plated through holes to match those of PCB left frame section 17, and another group of fourteen electrically conductive plated through holes to match those of PCB bottom frame section 18. For additional information on a bridge connector, see: application Ser. No. 61/110,042 (the subject matter of which is incorporated herein by reference).

Each layer of a PCB frame section may contain some plated through holes, and each layer of the bridge connector 24 will have a number of plated through holes arranged to match the plated through holes of the PCB frame section. In the following examples, the bridge connector 24 has groups of plated through holes arranged on a top layer and a bottom layer. In one example, the height of the assembly from the top surface of the bridge connector 24 to the top surface of the PCB frame sections is 1.92 millimeters. However, assembly profile of less than 1.2 millimeters is possible.

Figure 7:
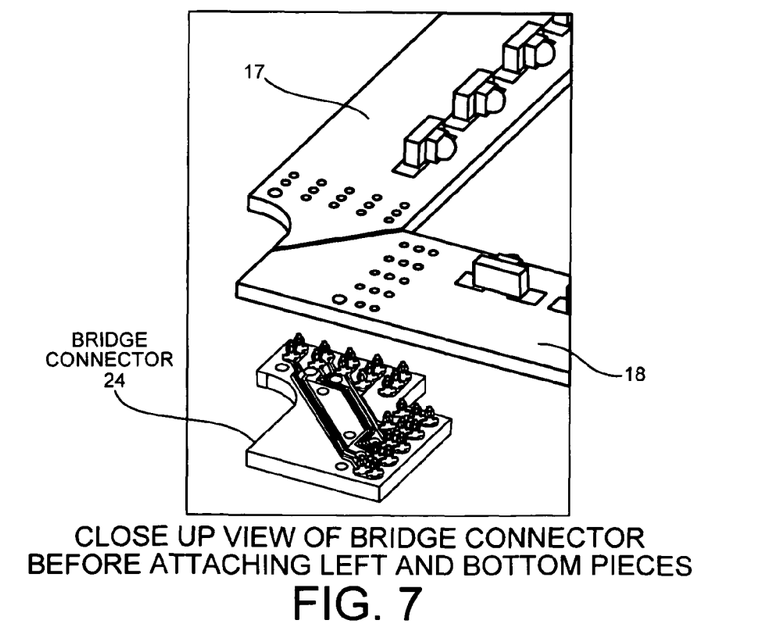
FIG. 7 is an exploded view of a corner section of FIG. 5 and a bridge connector.

FIG. 7 is an exploded view of corner section 21 of FIG. 5 and bridge connector 24, showing the bottom side of bridge connector 24 facing toward bottom side of PCB left frame section 17 and bottom side of PCB bottom frame section 18. In this example bridge connector 24 is formed in an L-shape, such that one edge of the bridge connector 24 extends in one direction and another edge of bridge connector 24 extends in a perpendicular direction. The pins and plated through holes of the first coupling portion are aligned along one edge and the pins and plated through holes of the second coupling portion are aligned along a perpendicular edge. This example design allows the bridge connector 24 to connect two frame sections in an L-shaped arrangement. Bridge connector 24 may also be designed with coupling portions arranged in a straight line, such that frame sections are connected in a straight line, or at other angles as the design requires.

Figure 8:
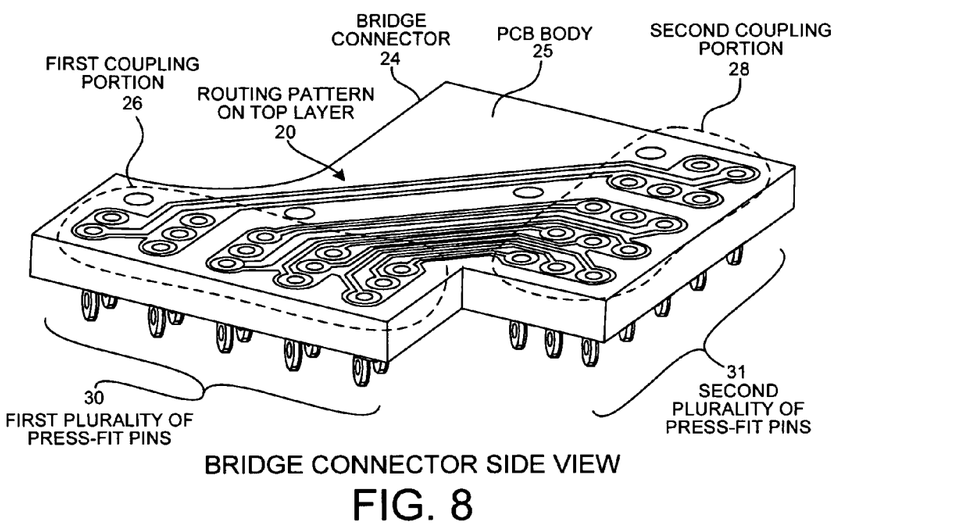
FIG. 8 is a top side view of the bridge connector.

FIG. 8 is a view from the top side of the bridge connector 24. A two-dimensional array of plated through holes are formed on a first coupling portion 26 of the PCB body 25 to match a two-dimensional array of electrically conductive plated through holes of PCB bottom frame section 18. Another two-dimensional array of plated through holes are formed on a second coupling portion 28 of the PCB body 25 to match a two-dimensional array of electrically conductive plated through holes of PCB left frame section 17. First coupling portion 26 and second coupling portion 28 do not overlap. Each coupling portion is formed on a substantially rectangular portion of the rigid printed circuit structure.

A routing pattern of signal conductors 20 are disposed on the top layer of the PCB body 25 of the bridge connector, forming electrical connections between plated through holes of the two groupings on the bridge connector 24. The signal conductors are typically copper foil traces of 0.7 mil or 1.4 mil gauge. Each trace is normally rated to handle up to one amp, but some traces are rated to handle up to five amps. In typical applications, conductors are no more than 2 inches in length due to the desired small size of the bridge connector.

Extending outward from the bottom side of the bridge connector 24 is a first plurality of press-fit pins 30 retained in the corresponding through holes on the first coupling portion 26 and the second plurality of press-fit pins 31 retained on the second coupling portion 28. One end of each press-fit pin extends into the PCB body 25 of the bridge connector 24 through a plated through hole. Each press-fit pin thus forms an electrical connection through the plated through hole formed on the first coupling portion 26, through a signal conductor, and to the associated plated through hole and press-fit pin of the second coupling portion 28. In typical applications, bridge connectors utilize more than five press-fit pins on each coupling portion.

Figure 9:
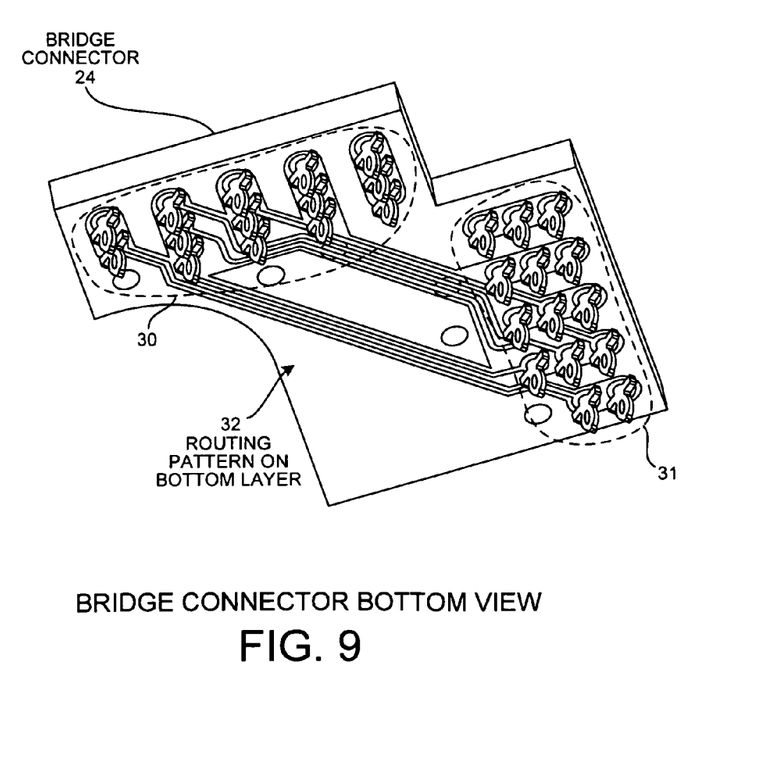
FIG. 9 diagrams the bottom side view of the bridge connector.

FIG. 9 shows the bridge connector 24 from the bottom side. A second routing pattern of signal conductors 32 is disposed on the bottom layer of the PCB body 25 of the bridge connector 24, forming electrical connections between plated through holes of the two groupings on the bridge connector 24. The bottom view shows that the extended ends of the first group 30 and second group 31 of press-fit pins are compliant pin ends.

Press-fit pins allow the bridge connector 24 to attach to PCB frame sections by engaging through holes on the PCB components. The press-fit pins also provide the retentive force to mechanically couple the bridge connector 24 to the PCB frame sections. Each compliant end press-fit pin provides 0.7 kilograms of retentive force. Press-fit pins provide a sturdy assembly so that a four-piece assembly can be assembled such that it is nearly as structurally secure as a single-piece of PCB. In typical applications, the rigid printed circuit structure of the bridge connector has no planar surface greater than 5 square inches due to the typical dimensions of PCB frame sections.

Figure 10:
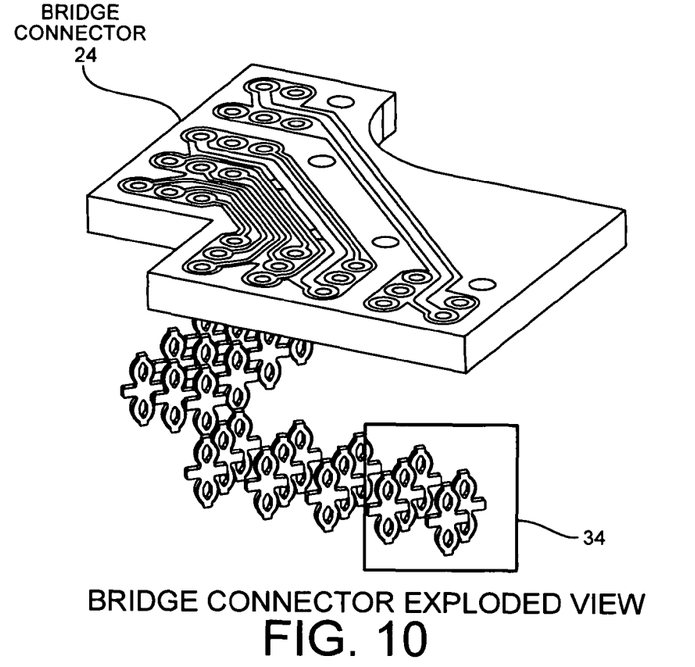
FIG. 10 is an exploded view of the bridge connector, showing press-fit pins as if they were extracted from their associated bridge connector plated through holes.
Figure 11:
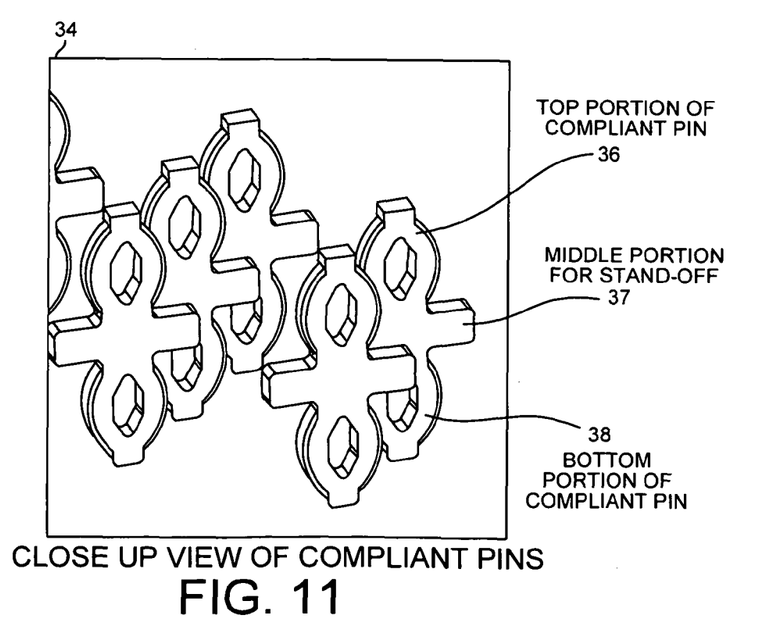
FIG. 11 is a detailed diagram of the compliant press-fit pins of FIG. 10.

FIG. 10 is an exploded view of the bridge connector 24, showing press-fit pins 34 as if they were extracted from their associated bridge connector 24 plate through holes. FIG. 11 shows a detail of the compliant press-fit pins 34 of FIG. 10. Each press-fit pin is stamped from a sheet of conductive copper alloy. The top portion 36 of a press-fit pin has a compliant pin end, which fits into a plated through hole of the bridge connector 24. The middle portion of a pin has a stand-off portion 37 that separates the bridge connector 24 from any connected PCB frame section. The bottom portion 38 of a press-fit pin also has a compliant pin end, which engages the through hole of a PCB and fit into the hole of a PCB frame section.

Figure 12:
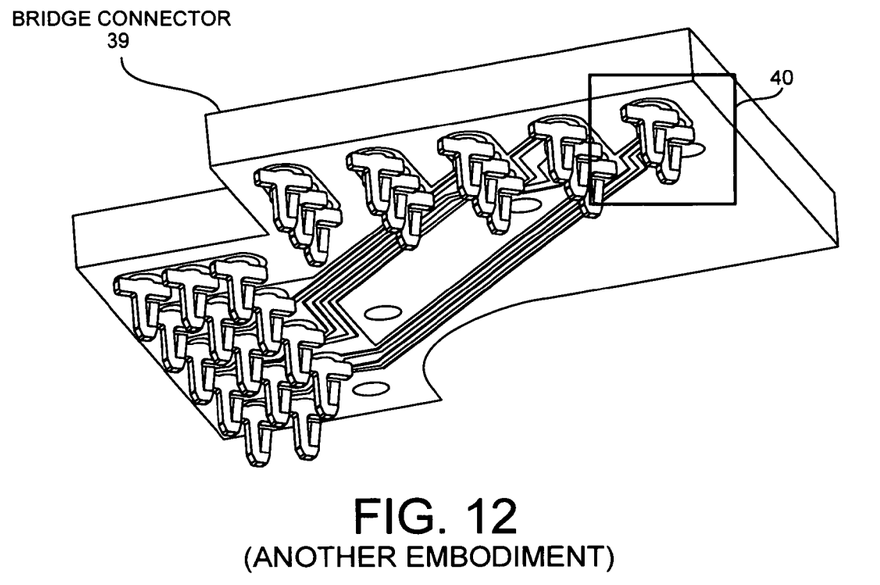
FIG. 12 is a diagram of a bottom view of another embodiment of a bridge connector.

FIG. 12 is a bottom view of another embodiment of a bridge connector 39. In this embodiment, the bottom portion of each press-fit pin has a spring-beam end. Such a press-fit pin with a spring-beam end is also known as a snap pin. Similar to the bridge connector embodiment of FIG. 8 which utilizes compliant pins, bridge connector 39 has two coupling portions which attach two separate PCB components. Snap pins are disposed along each coupling portion. Coupling portions attach to a PCB component through the snap pins, which engage the matching through holes on the PCB component.

Figure 13:
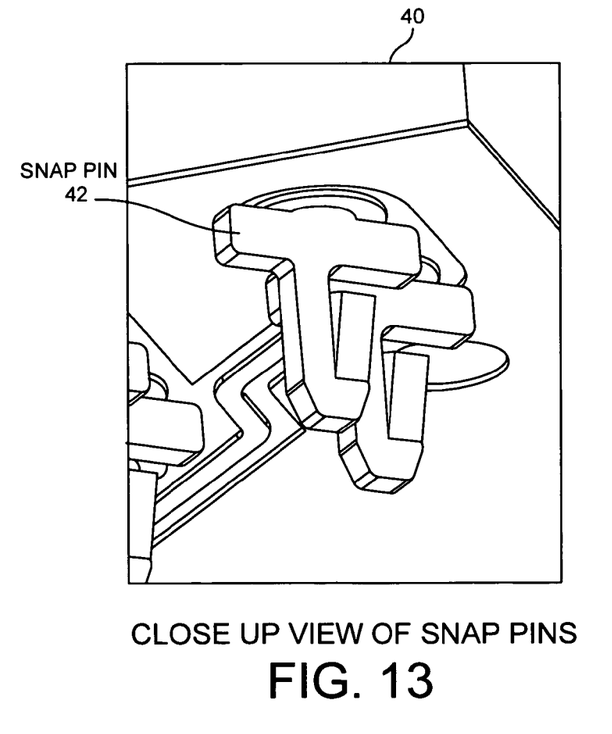
FIG. 13 is a diagram of a close up view of section 40 of FIG. 12 showing snap pins disposed along a coupling portion of the bridge connector.

FIG. 13 is a close up view of section 40 of FIG. 12 showing snap pins disposed along a coupling portion of bridge connector 39. The compliant portion 43 of the snap pin 42 is inside a plated through hole of the bridge connector 39. A middle stand-off portion 44 of the snap pin 42 is flush against the bottom side of the body of the bridge connector 39. Further below is the bottom spring beam portion 45 of the snap pin 42, ready to be snapped into a plated through hole of a PCB frame section.

Figure 14:
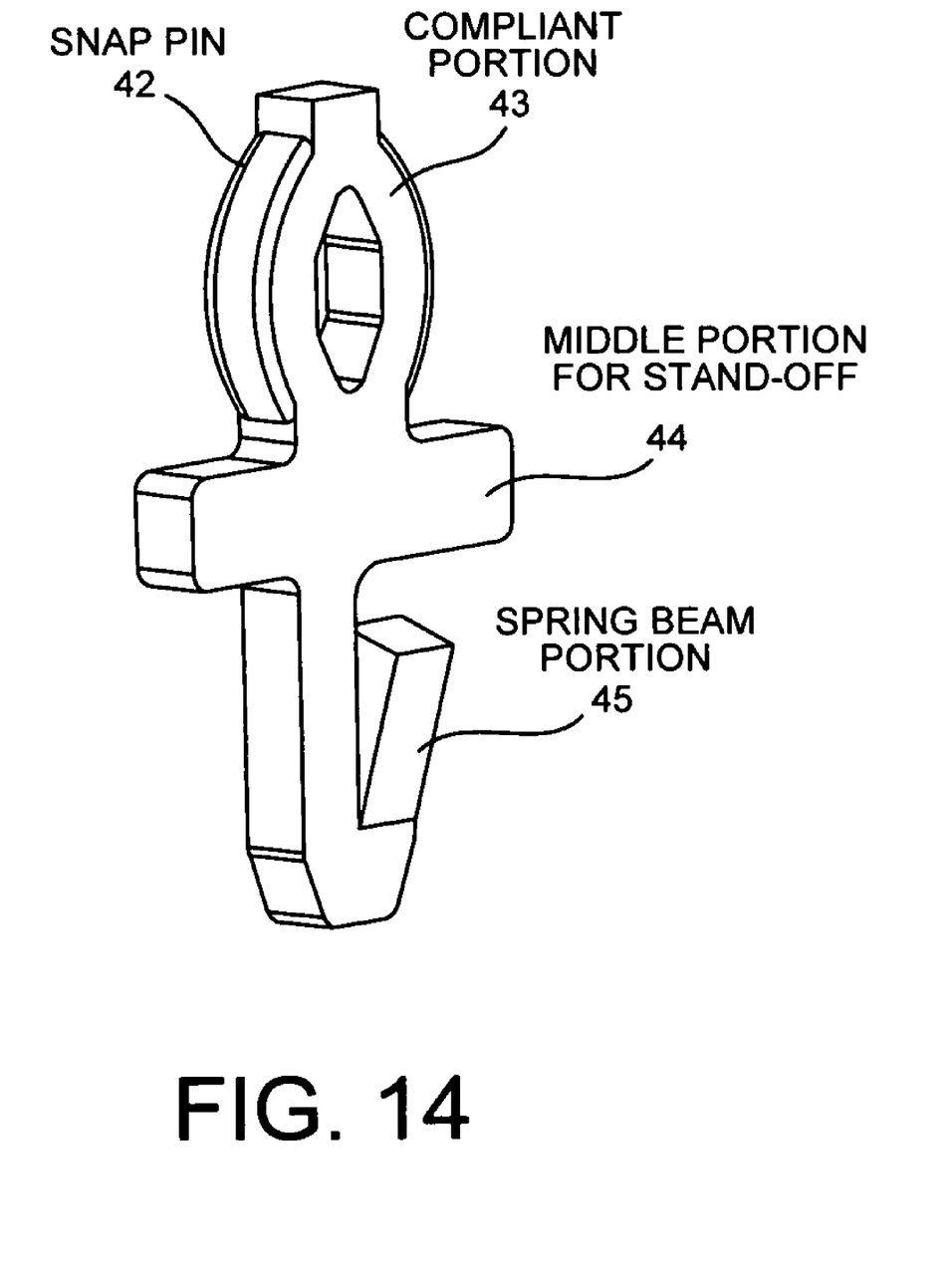
FIG. 14 is a close up diagram of a snap pin.

FIG. 14 is a further detail of snap pin 42, removed from the bridge connector 39. The top compliant portion 43 of the snap pin 40 is typically pressed into a plated through hole of the bridge connector 39. The bottom portion 45 of the snap pin 42 in a spring-beam shape, with the stand-off portion 44 separating the top and bottom portions.

The spring beam portion 45 of snap fit pin 42, allows for easy, hand assembly. Bridge connector 39 can be snapped into the PCB components with considerably less force than a compliant pin. However, bridge connector 39 cannot be pulled out by hand because of the spring mechanism which causes the snap pin to lock into place after engaging the corresponding through hole on the PCB component. The spring-beam pin holds with less retentive force than the compliant pin.

Figure 15:
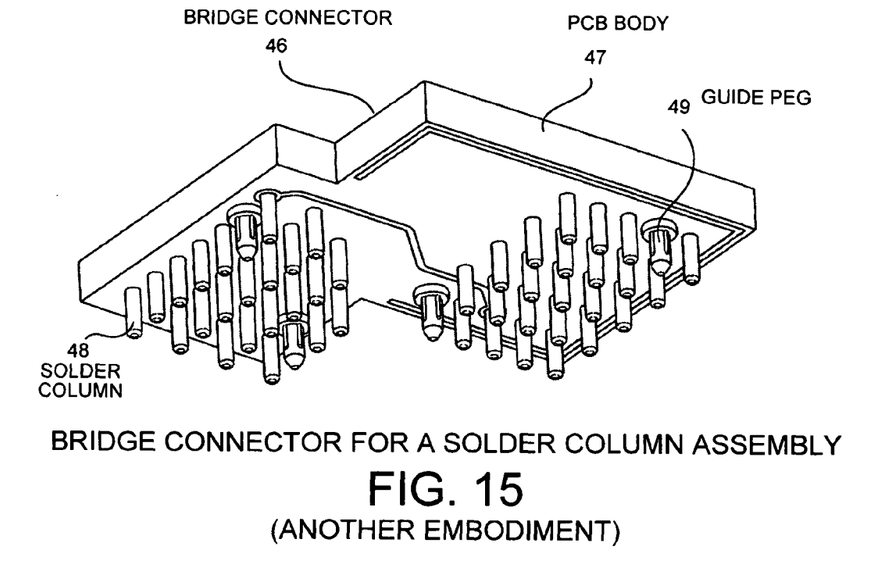
FIG. 15 is a diagram of another embodiment of the bridge connector utilizing solder columns.

FIG. 15 shows an embodiment of the bridge connector 46 using solder columns instead of press-fit pins. A solder column 48 inserted in each plated through hole of the PCB body 47 extends outward from the bottom side of the bridge connector 46. A corner of an IR touch sensor frame is assembled by inserting the solder columns of one coupling portion of the bridge connector 46 into the matching plated through holes of a PCB frame section and inserting the solder columns of the other coupling portion of the bridge connector 46 into the matching plated through holes of another PCB frame section, forming an L-shape. Non-conductive guide pegs 49 extending from the bottom surface of the bridge connector 46 are also inserted into matched through holes on the PCB frame sections to provide the retentive force for mechanical coupling.

Figure 16:
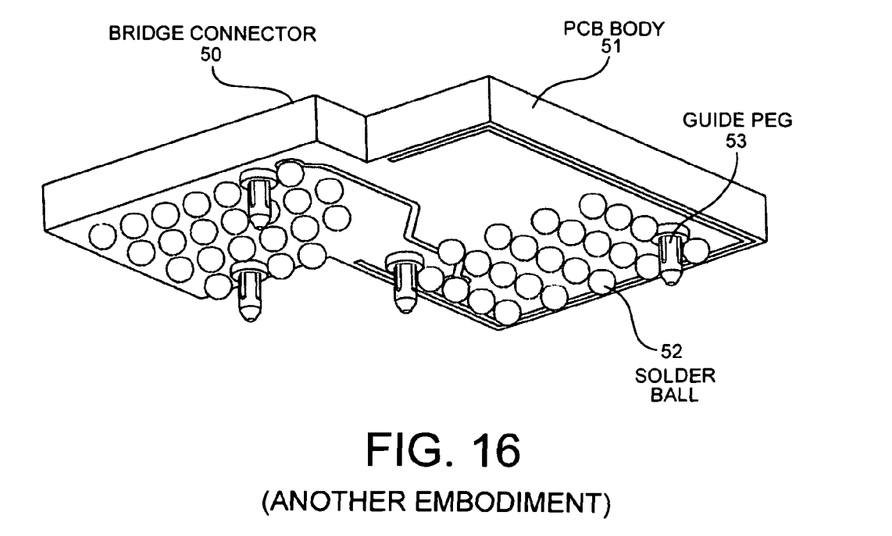
FIG. 16 is a diagram of another embodiment utilizing solder balls.

FIG. 16 shows an embodiment using solder balls instead of solder columns. A solder ball 52 extending from each contact or plated through hole of the bridge connector 50 extends outward from the bottom side of the bridge connector 50. A corner of an IR touch sensor frame is assembled by inserting non-conductive guide pegs 53 into the matching plated through holes of the PCB frame sections to provide the retentive force for mechanical coupling. A two-dimensional array of solder balls on one coupling portion of the bridge connector 50 is arranged to match solder pads of a first PCB frame section when the guide pegs 53 are inserted, forming the electrical connection between the bridge connector 50 and first PCB frame section. A two-dimensional array of solder balls on the other coupling portion of the bridge connector 50 is arranged to match solder pads of a second PCB frame section when the guide pegs 53 are inserted, forming the electrical connection between the bridge connector 50 and second PCB frame section.

Figure 17:
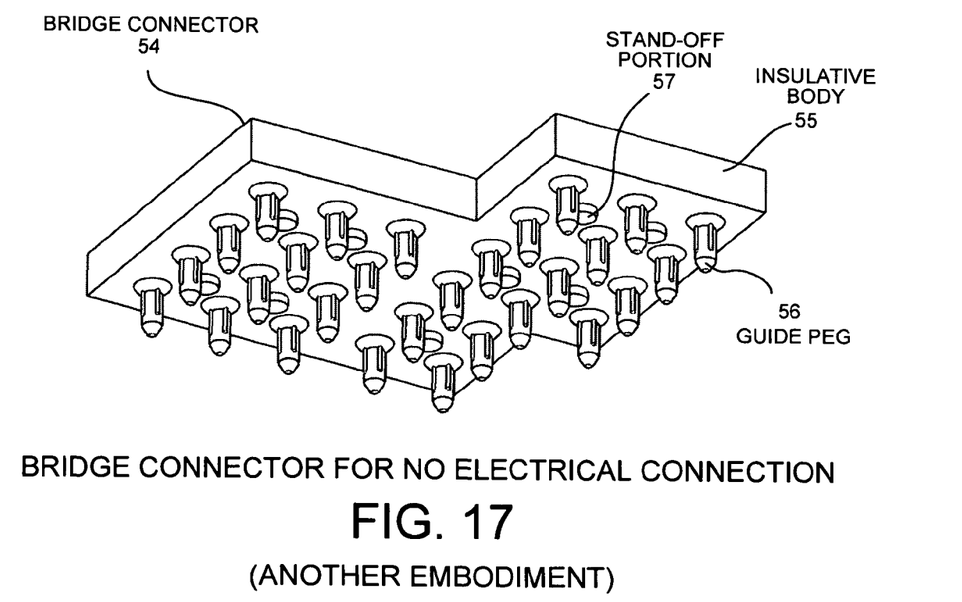
FIG. 17 is a diagram of another embodiment when no electrical connection is desired.

FIG. 17 shows an embodiment for when no electrical connection is required. Typically, an electrical connection is required at only three corners of the IR touch sensor frame. The fourth corner can be assembled using a dummy connector. The dummy connector comprises a planar insulative body 55 with guide pegs 56 extending from the bottom surface of the planar insulative body 55. One grouping of guide pegs is arranged to match through holes of a first PCB frame section and the other grouping of guide pegs is arranged to match the through holes of a second PCB frame section. The guide pegs provide the retentive force for mechanical coupling of the first PCB frame section, dummy connector, and second PCB frame section into an L-shape. A plurality of non-conductive stand-off portions 57 extend from the bottom surface of the bridge connector 54 to provide separation between the bottom surface of bridge connector 54 and the bottom surfaces of attached PCB frame sections.

Figure 18:
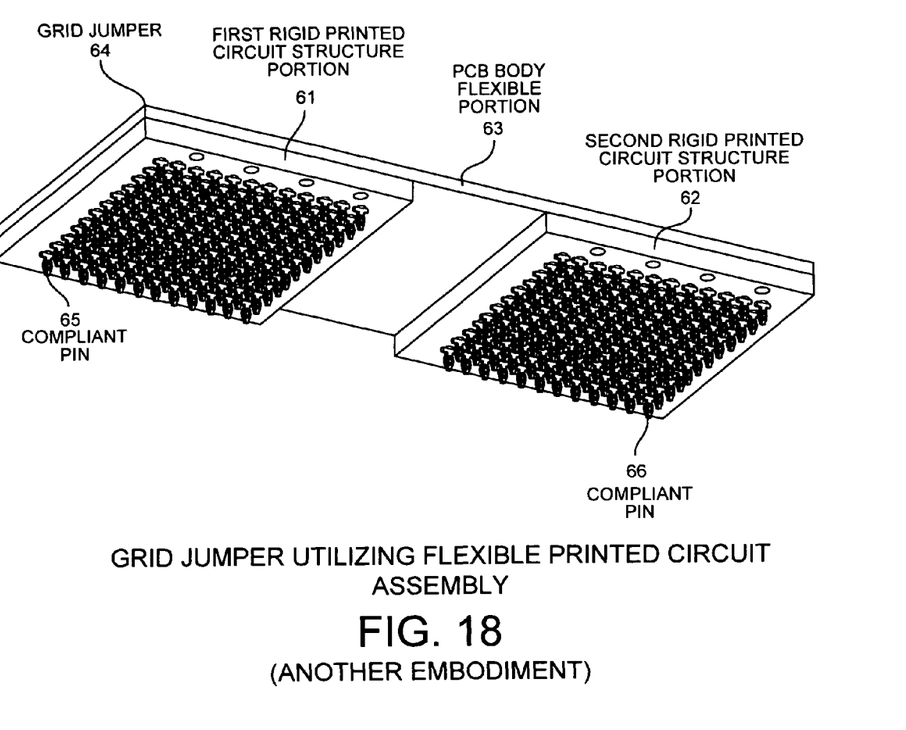
FIG. 18 shows an embodiment of a grid jumper wherein two separate rigid portions are attached by a flexible portion of the PCB body.

FIG. 18 shows an embodiment of a grid jumper wherein two separate rigid portions 61 and 62 are attached by a PCB body flexible portion 63. Press-fit pins are disposed along the surface of a first rigid printed circuit structure portion 61 and a second rigid printed circuit structure portion 62. In this embodiment, the press-fit pins of FIG. 18 are compliant pins. The grid jumper attaches to other PCB components through the two-dimensional array of compliant pins disposed on the rigid portions. The compliant pins, as they are disposed on the rigid portions, match respective through holes on a separate PCB component such that each rigid portion attaches to the matching through holes of the separate PCB component. Compliant pin 65 (located on rigid portion 61) is electrically connected to compliant pin 66 (located on rigid portion 62). Since certain compliant pins of rigid portion 61 are electrically connected to rigid portion 62, the grid jumper 64 forms conductive pathways between two PCB components. Grid jumper 64 can be utilized to electrically connect two separate PCB components. Although PCB flexible portion 63 is substantially flexible, both PCB components are mechanically attached through the grid jumper and can move relative to each other.

Figure 19:
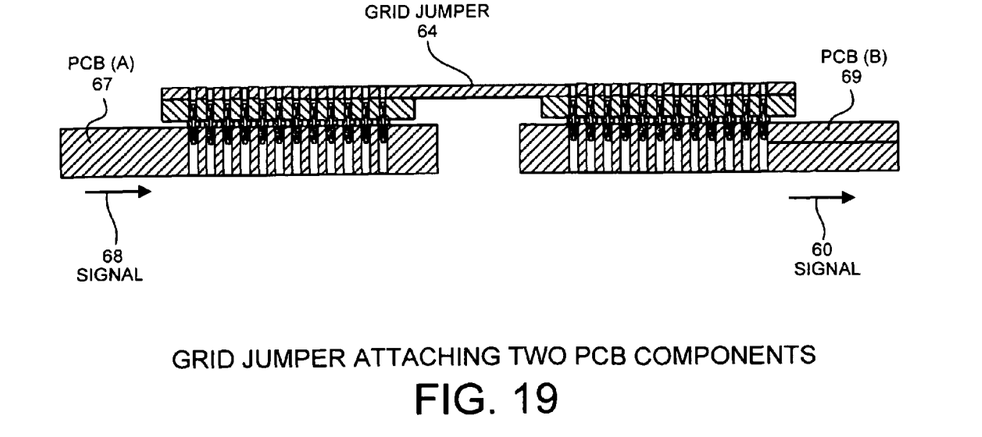
FIG. 19 shows an embodiment of the grid jumper attaching two separate PCB components.

FIG. 19 shows an embodiment of the grid jumper attaching two separate PCB components, PCB(A) 67 and PCB(B) 69. Because certain compliant pins in the rigid portions are electrically connected and these compliant pins engage through holes located at matching locations on the PCB components, certain conductive pathways exist between PCB(A) 67 and PCB(B) 69. Grid jumper 64 provides the desired electrical coupling between PCB(A) 67 and PCB(B) 69, such that a signal may be communicated between PCB(A) 67 and PCB(B) 69. For example, signal 68 propagates through grid jumper 64, and reaches PCB(B) 69 as signal 60. Flexible portion 63 of grid jumper 64 allows for relative movement of each rigid portion with respect to the other rigid portion. Such flexibility provides ease of attachment and movement between PCB(A) 67 and PCB(B) 69.

Figure 20:
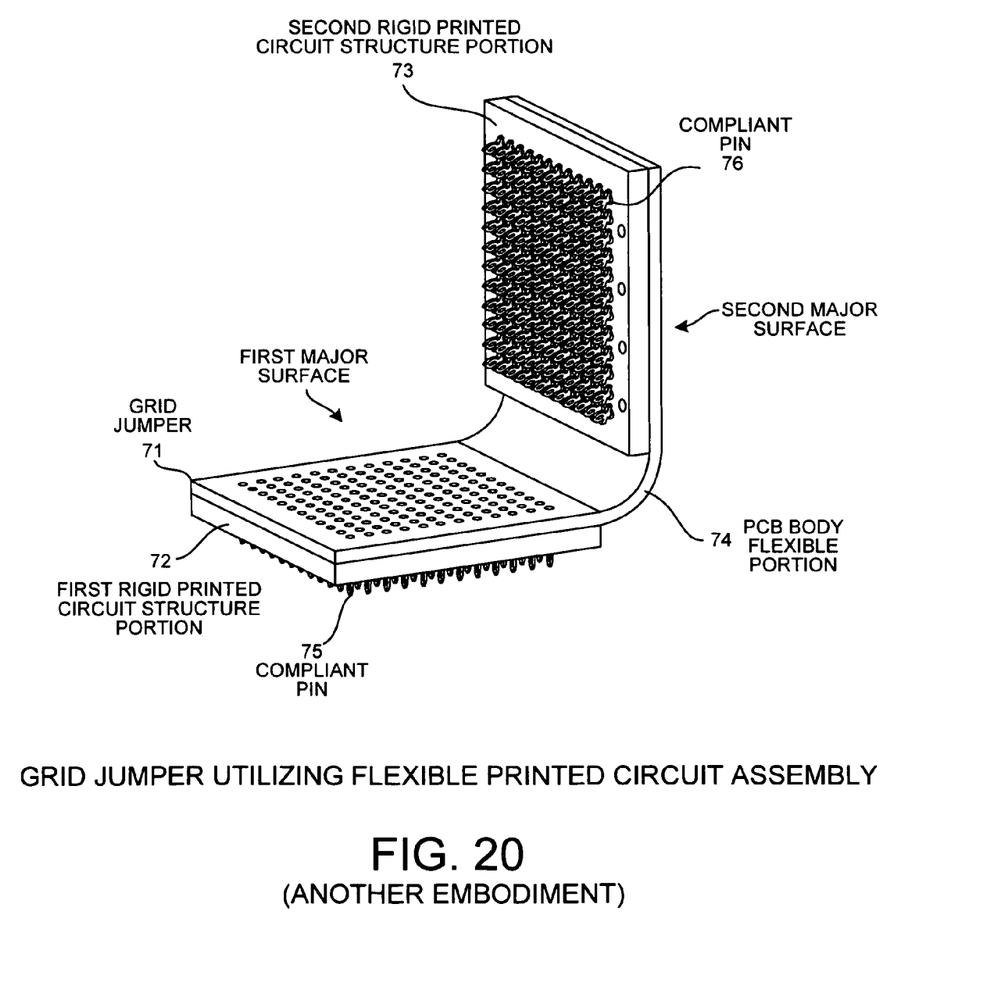
FIG. 20 shows another embodiment of a grid jumper wherein a rigid portion extends along one major surface of the grid jumper, and the other rigid portion extends along another major surface of the grid jumper.

FIG. 20 shows another embodiment of a grid jumper wherein a first rigid printed circuit structure portion 72 extends along a first major surface of grid jumper 71, and a second rigid printed circuit structure portion 73 extends along a second major surface of grid jumper 71. Press-fit pins are disposed on each rigid surface, and each rigid portion retains press-fit pins extending from a different major surface of the grid jumper 71. In this embodiment of a grid jumper, press-fit pins are compliant pins. The grid jumper attaches to other PCB components through the two-dimensional array of compliant pins disposed on rigid portions 72 and 73. The compliant pins as they are disposed on the rigid portions, match respective through holes on a separate PCB component, such that each rigid portion attaches to the matching through holes of the separate PCB component. Compliant pin 76 (located on rigid portion 73) is electrically connected to compliant pin 75 (located on rigid portion 72). Since certain compliant pins of rigid portion 73 are electrically connected to rigid portion 72, the grid jumper forms conductive pathways between two PCB components. Grid jumper can be utilized to electrically connect two separate PCB components. In FIG. 20, flexible portion 74 forms a substantially right angle, providing for two separate PCB components to be attached perpendicular with respect to each other. Although PCB flexible portion 74 is substantially flexible, both PCB components are still mechanically attached through the grid jumper.

Figure 21:
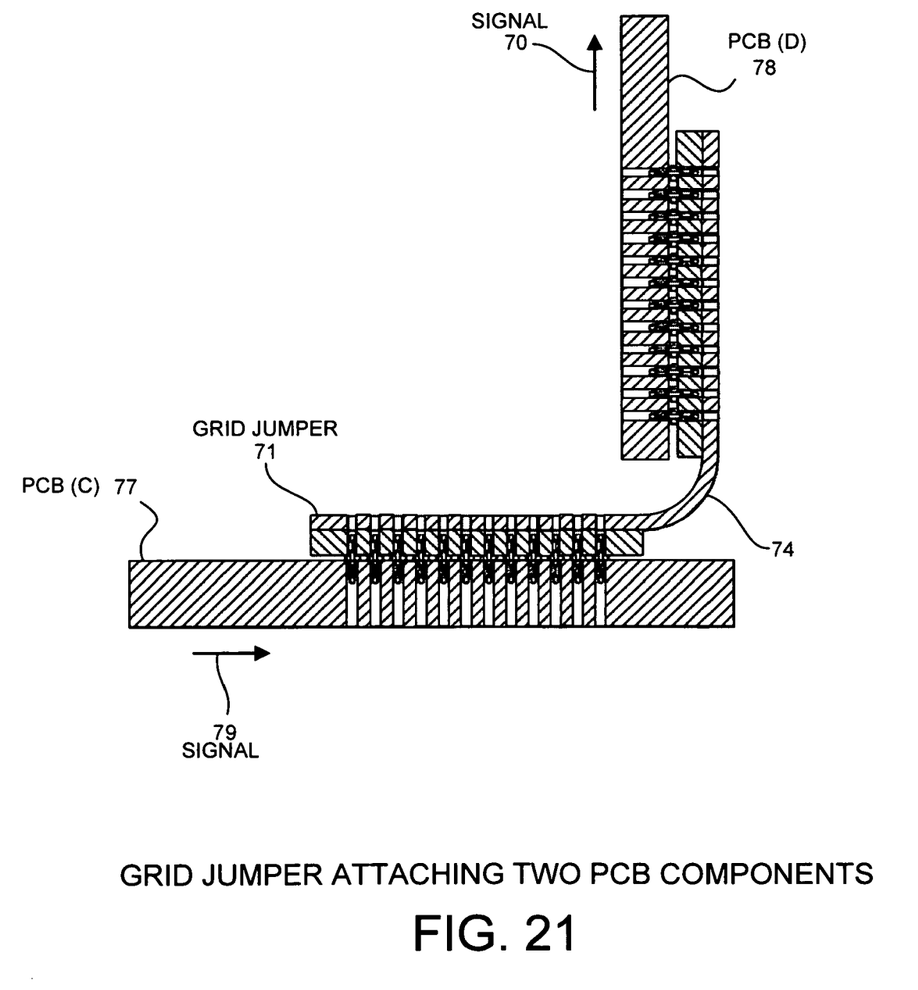
FIG. 21 shows an embodiment of the grid jumper attaching two separate PCB components substantially perpendicular to each other.

FIG. 21 shows an embodiment of the grid jumper attaching two separate PCB components, PCB(C) 77 and PCB(D) 78 substantially perpendicular to each other. Certain compliant pins in the rigid portions are electrically connected to each other and these compliant pins attach at through holes located at matching locations on the PCB components. Therefore, certain conductive pathways exist between PCB(C) 77 and PCB(D) 78, such that a signal may be communicated between PCB(C) 77 and PCB(D) 78. Grid jumper 71 provides both the desired electrical coupling between PCB(C) 77 and PCB(D) 78, and mechanical coupling through a right angle connection. For example, signal 79 propagates through grid jumper 71, and reaches PCB(D) 78 as signal 70. Flexible portion 74 of grid jumper 71 allows for relative movement of each rigid portion with respect to the other rigid portion. Such flexibility provides for ease of attachment and movement between PCB(C) 77 and PCB(D) 78.

Although certain specific exemplary embodiments are described above in order to illustrate the invention, the invention is not limited to the specific embodiments. For example, the described embodiments describe applications involving PCBs, though various types of printed circuit structures may be used instead. For example, the shape and size of the bridge connector, as well as the number and location of press-fit pins on the bridge connector depend on the PCB components being coupled together through the bridge connector and is not limited to the described embodiments. Similarly, the shape and size of the grid jumper, and the number, arrangement and location of the press-fit pins is dependent on the PCB components being coupled together and is not limited to the described embodiments.

Accordingly, various modifications, adaptations, and combinations of various features of the described embodiments can be practiced without departing from the scope of the invention as set forth in the claims.

What is claimed is:

1. An apparatus comprising:
a first plurality of press-fit pins comprising more than five press-fit pins;
a second plurality of press-fit pins comprising more than five press-fit pins;
a first rigid printed circuit structure having a first coupling portion and a second coupling portion, wherein a first plurality of through holes extends through the first coupling portion, each of the first plurality of press-fit pins engages a corresponding respective one of the first plurality of through holes thereby extending outward from a side of the first rigid printed circuit structure, wherein a second plurality of through holes extends through the second coupling portion, wherein each of the second plurality of press-fit pins engages a corresponding respective one of the second plurality of through holes thereby extending outward from the side of the first rigid printed circuit structure, the first rigid printed circuit structure further comprising a plurality of conductors, wherein none of the plurality of conductors is longer than two inches, wherein each respective one of the conductors extends from one of the first plurality of through holes to a corresponding respective one of the second plurality of through holes, wherein the first rigid printed circuit structure has a first edge and a second edge, wherein the first edge extends in a first direction, wherein the second edge extends in a second direction, wherein some of the first plurality of through holes are aligned along the first edge, and wherein some of the second plurality of through holes are aligned along the second edge;

a second rigid printed circuit structure having a plurality of through holes, wherein the first plurality of press-fit pins engages the plurality of through holes of the second rigid printed circuit structure thereby fixing the second rigid printed circuit structure to the first rigid printed circuit structure; and a third rigid printed circuit structure having a plurality of through holes, wherein the second plurality of press-fit pins engages the plurality of holes of the third rigid printed circuit structure thereby fixing the third rigid printed circuit structure to the first rigid printed circuit structure.

2. The apparatus of claim 1, wherein the first coupling portion is a first substantially rectangular portion of the first rigid printed circuit structure, wherein the first edge is an edge of the first coupling portion, wherein the second coupling portion is a second substantially rectangular portion of the first rigid printed circuit structure, wherein the second edge is an edge of the second coupling portion, and wherein the first and second coupling portions do not overlap.

3. The apparatus of claim 1, wherein no active electronic components are disposed on the first rigid printed circuit structure.

4. The apparatus of claim 1, wherein the first direction is substantially perpendicular to the second direction, and wherein the first edge and the second edge do not meet.

5. The apparatus of claim 1, wherein the first rigid printed circuit structure has no planar surface having a surface area greater than five square inches.

6. The apparatus of claim 1, wherein the first plurality of press-fit pins, the second plurality of press-fit pins, and the first rigid printed circuit structure are a bridge connector, and wherein the bridge connector is part of a touch screen assembly.

7. The apparatus of claim 1, wherein two major parallel extending edges of the second rigid printed circuit structure are at least ten times longer than a width of the second rigid printed circuit structure, and wherein two major parallel extending edges of the third rigid printed circuit structure are at least ten times longer than a width of the third rigid printed circuit structure.

8. The apparatus of claim 1, wherein the second rigid printed circuit structure is an elongated rigid printed circuit structure.

9. The apparatus of claim 1, wherein the first plurality of press-fit pins extends from a first major surface of the first rigid printed circuit structure, and wherein the second plurality of press-fit pins extends from a second major surface of the first rigid printed circuit structure.

10. The apparatus of claim 1, wherein the apparatus is part of a touch screen assembly.

11. The apparatus of claim 1, wherein the first rigid printed circuit structure is for communicating an electrical signal between the second and third rigid printed circuit structures.

12. The apparatus of claim 1, wherein the first rigid printed circuit structure is for mechanically fixing the first rigid printed circuit structure to the second rigid printed circuit structure using the first plurality of press-fit pins, and wherein the first rigid printed circuit structure is also for mechanically fixing the first rigid printed circuit structure to the third rigid printed circuit structure using the second plurality of press-fit pins.

13. An apparatus comprising:
a first plurality of press-fit pins comprising more than five press-fit pins;
a second plurality of press-fit pins comprising more than five press-fit pins;
a first rigid printed circuit structure having a first coupling portion and a second coupling portion, wherein a first plurality of through holes extends through the first coupling portion, each of the first plurality of press-fit pins engages a corresponding respective one of the first plurality of through holes, wherein a second plurality of through holes extends through the second coupling portion, wherein each of the second plurality of press-fit pins engages a corresponding respective one of the second plurality of through holes, the first rigid printed circuit structure further comprising a plurality of conductors, wherein none of the plurality of conductors is longer than two inches, wherein each respective one of the conductors extends from one of the first plurality of through holes to a corresponding respective one of the second plurality of through holes, wherein the first rigid printed circuit structure has a first edge and a second edge, wherein the first edge extends in a first direction, wherein the second edge extends in a second direction, wherein some of the first plurality of through holes are aligned along the first edge, and wherein some of the second plurality of through holes are aligned along the second edge;

a second rigid printed circuit structure having a plurality of through holes, wherein the first plurality of press-fit pins engages the plurality of through holes of the second rigid printed circuit structure thereby fixing the second rigid printed circuit structure to the first rigid printed circuit structure; and a third rigid printed circuit structure having a plurality of through holes, wherein the second plurality of press-fit pins engages the plurality of holes of the third rigid printed circuit structure thereby fixing the third rigid printed circuit structure to the first rigid printed circuit structure, wherein a plurality of infrared devices is disposed along an edge of the second rigid printed circuit board, wherein a plurality of the infrared devices is disposed along an edge of the third rigid printed circuit board, and wherein the infrared devices are taken from the group consisting of: infrared transmitters, and infrared receivers.

14. An assembly comprising:
a first elongated printed circuit structure having two major parallel extending edges;
a second elongated printed circuit structure having two major parallel extending edges, wherein the two edges of the second elongated printed circuit structure are perpendicular to the two edges of the first elongated printed circuit structure;
a bridge connector comprising:
a first plurality of press-fit pins that engages through holes in the first elongated printed circuit structure;
a second plurality of press-fit pins that engages through holes in the second elongated printed circuit structure; and
a rigid printed circuit structure having a first coupling portion and a second coupling portion, wherein a first plurality of through holes extends through the first coupling portion, each of the first plurality of press-fit pins engages a corresponding respective one of the first plurality of through holes, wherein a second plurality of through holes extends through the second coupling portion, wherein each of the second plurality of press-fit pins engages a corresponding respective one of the second plurality of through holes, the rigid printed circuit structure further comprising a plurality of conductors, wherein none of the plurality of conductors is longer than two inches, and wherein each respective one of the conductors extends from one of the first plurality of through holes to a corresponding respective one of the second plurality of through holes;

a first plurality of infrared devices extending in a row along an edge of the first elongated printed circuit structure; and a second plurality of infrared device extending in a row along an edge of the second elongated printed circuit structure.

15. An apparatus comprising:
a first plurality of press-fit pins comprising more than five press-fit pins;
a second plurality of press-fit pins comprising more than five press-fit pins; and
a printed circuit structure having a first coupling portion and a second coupling portion, wherein a first plurality of through holes extends through the first coupling portion, each of the first plurality of press-fit pins engages a corresponding respective one of the first plurality of through holes thereby extending outward from a side of the printed circuit structure, wherein a second plurality of through holes extends through the second coupling portion, wherein each of the second plurality of press-fit pins engages a corresponding respective one of the second plurality of through holes thereby extending outward from the side of the printed circuit structure, the printed circuit structure further comprising a plurality of conductors, wherein none of the plurality of conductors is longer than two inches, wherein each respective one of the conductors extends from one of the first plurality of through holes to a corresponding respective one of the second plurality of through holes, and wherein the first coupling portion is a first rigid printed circuit structure, wherein the second coupling portion is a second rigid printed circuit structure, and wherein the printed circuit structure further comprises a flexible printed circuit structure fixed to the first and second rigid printed circuit structures so that the first and second rigid printed circuit structures can move with respect to one another.

* * * * *